(12) United States Patent
Delzer

(10) Patent No.: US 6,229,412 B1
(45) Date of Patent: *May 8, 2001

(54) PIN DIODE SWITCH TO AC GROUND WITH THREE BIASING SOURCES

(75) Inventor: Donald J. Delzer, Beaverton, OR (US)

(73) Assignee: Tektronix, Inc., Beaverton, OR (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/283,115

(22) Filed: Mar. 31, 1999

(51) Int. Cl.[7] ....................................................... H01P 1/15
(52) U.S. Cl. ............................................. 333/262; 327/503
(58) Field of Search ............................. 333/262; 327/503, 327/504

(56) References Cited

U.S. PATENT DOCUMENTS

| | | | |
|---|---|---|---|
| 3,165,639 | * 1/1965 | Robinson | 327/504 |
| 3,755,758 | 8/1973 | Leeson | 333/81 A X |
| 3,969,681 | 7/1976 | Fincke | 330/56 |
| 4,649,354 | 3/1987 | Khanna | 331/99 |
| 4,883,984 | * 11/1989 | Kess | 333/262 |
| 5,793,269 | 8/1998 | Ervasti et al. | 333/235 |

* cited by examiner

*Primary Examiner*—Justin P. Bettendorf
(74) *Attorney, Agent, or Firm*—William K. Bucher; Francis I. Gray

(57) ABSTRACT

A PIN diode switch reduces energy loss and stray capacitance by providing first and second series connected PIN diodes between first and second biasing sources. A third biasing source is coupled to the common node between the two PIN diodes via a first resistive element. A second resistive element is coupled between the PIN diodes and the second biasing source. An electronic switch couples a negative voltage source via a current generating means to bias the PIN diodes to a conductive ON state. AC current is coupled to ground in the ON state via a dual path circuit that includes one of the PIN diodes and a low loss capacitive element connected to the PIN diode and second resistive element node in one path and the other PIN diode and the biasing source to ground in the other path. In the OFF state the biasing sources provide reverse bias voltages for minimizing the reverse capacitance of the PIN diodes and are connected in a way that minimizes stray capacitance that is connected to the switched element. The resistance of the parallel-connected resistive elements are large enough to minimize energy loss though the biasing sources in the OFF state.

5 Claims, 4 Drawing Sheets

US 6,229,412 B1

PIN DIODE SWITCH TO AC GROUND WITH THREE BIASING SOURCES

BACKGROUND OF THE INVENTION

The present invention relates generally to PIN diode switching circuits and more particularly to a PIN diode switching circuit having a biasing arrangement providing minimum energy (highest Q).

A typical application for a high-Q PIN diode switching circuit is to add tuning capacitance to a high-Q resonator. The resonator could be used as the frequency controlling element in an oscillator or a filter. An example of one type of PIN diode switching circuit is described in U.S. Pat. No. 4,649,354 for a switchable multi-frequency dielectric resonator oscillator. The oscillator includes a transistor that is operable for oscillation at a frequency determined by a feedback resonator connected to its control terminal. PIN diodes, acting as switching means, selectively connect any one of a plurality of feedback resonators to the control terminal of the transistor. The gate terminal of the transistor is connected to ground through an inductor and to the common anode terminals of the PIN diodes of the switching means. The diode switching means includes diodes that have their cathodes respectively connected to microstrip lines, which extend past the adjacently positioned dielectric resonators. The ends of the microstrip lines opposite the diodes are terminated to ground through resistors. An additional diode has its cathode terminated to ground through a resistor. Biasing terminals are connected to the cathodes of the PIN diodes via the respective microstrip lines or the resistor for the application of bias voltages to operate the diode switch.

In operation, one of the diodes in the diode switching means is forward biased while the other three diodes are reversed biased by application of appropriate voltages at the biasing terminals. Such biasing electrically connects one of the three microstrip lines or the resistor to the gate of the terminal of the transistor, while isolating the other three elements. The transistor will oscillate at the frequency determined by the resonant frequency of the dielectric resonator coupled to the gate terminal of the transistor through the diode switching means. To change the frequency at which the transistor is oscillating at, the forward biased diode in the switching mean is reversed biased by the application of the appropriate voltage at its biasing terminal, and a previously reversed biased diode is forward biased by the application of a forward bias voltage at its biasing terminal. To stop the transistor from oscillating, the diodes coupled through the microstrip lines to the biasing terminals are reversed biased and the biasing terminal coupled to the resistor is forwarded biased.

Typical PIN diode switching circuits used for adding tuning capacitance to high Q resonators generally causes problems for such circuits. The problems manifest themselves as stray capacitive reactance which limits the range of switchable resonator reactance, and stray resistance and conductance paths which cause energy loss in the resonator.

What is needed is a PIN diode switching circuit that minimizes energy losses through the switch in both the ON and OFF states of the switch.

SUMMARY OF THE INVENTION

Accordingly, the present invention is to a PIN diode switch having at least first and second series connected PIN diodes with a common node between them and coupled between first and second biasing sources. A third biasing source is coupled through a first resistive element to the common node and a second resistive element is coupled between the second biasing source and the series connected diodes with the second biasing source having an optimum voltage in the range of about two times the potential of the third biasing source. The third biasing source has an optimum voltage in the range of about two times the voltage potential difference between the second and third biasing sources. A switching means is coupled to the junction of the second resistive element and the PIN diodes to switch the PIN diodes between a conductive ON state to a nonconductive OFF state. A low loss capacitive element is coupled to the junction of the second resistive element and the PIN diodes and acts as a sink for AC signals when the PIN diodes are in the on state.

The switching means may be implemented as a current generating element and an electronic switch with a positive voltage potential being coupled to the current generating element through the electronic switch when the second biasing source has a negative potential. The switching means may also be implemented with a negative voltage potential being coupled to the current generating element through the electronic switch when the second biasing source has a positive potential. In the preferred embodiment of the present invention, the first biasing potential is circuit ground.

The objects, advantages and novel features of the present invention are apparent from the following detailed description when read in conjunction with appended claims and attached drawings.

DETAILED DESCRIPTION OF THE PREFERRED EMBODIMENT

Figure 1:
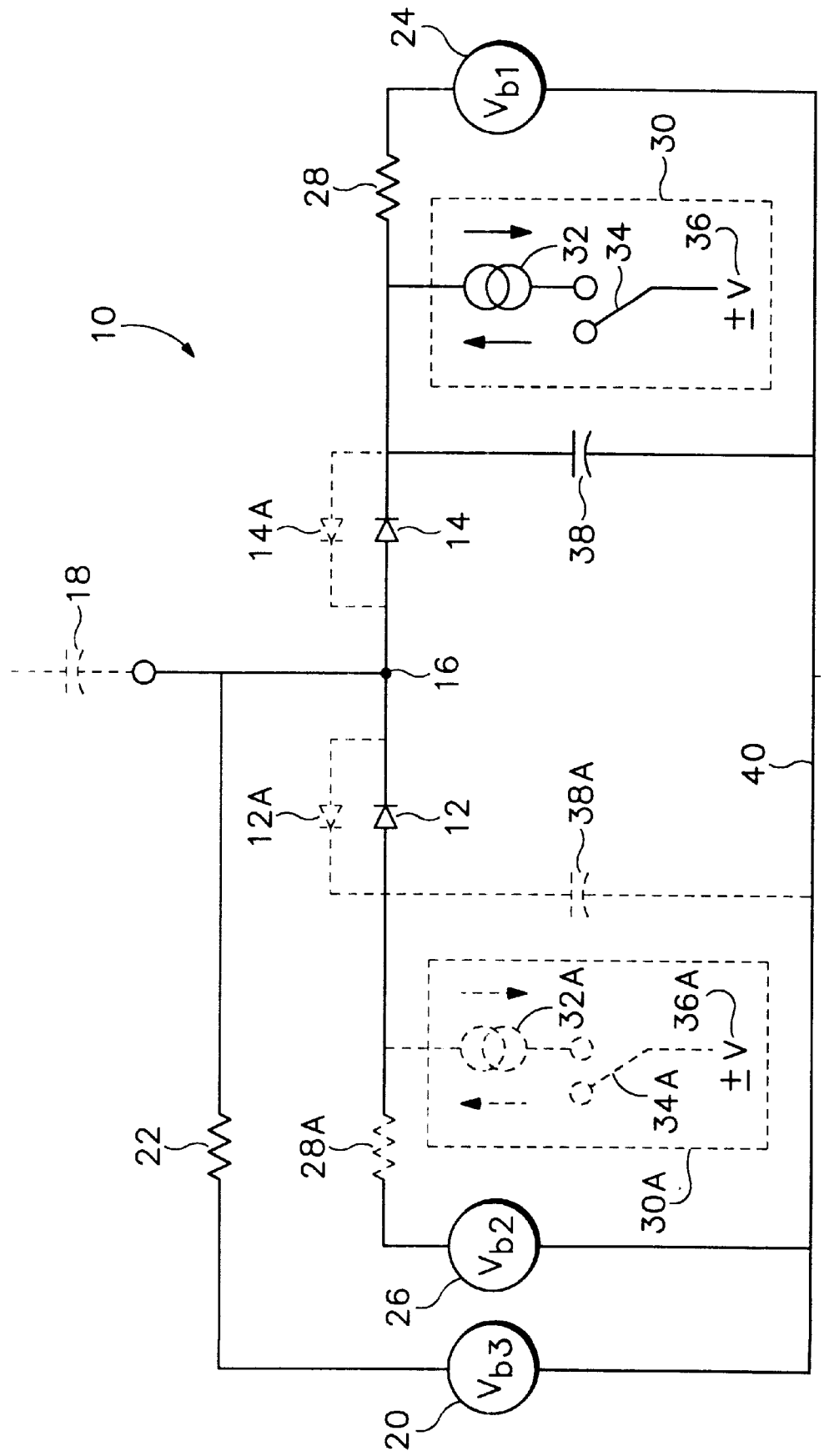
FIG. 1 is a generalized schematic representation of the PIN diode switch according to the present invention.

FIG. 1 shows a generalized schematic representation of the PIN diode switch 10 according to the present invention. The PIN diode switch 10 includes series connected PIN diodes 12 and 14 having a common node 16. The common diode node 16 may be connected to a switching capacitor 18 of a resonator circuit, a filter circuit, or the like. The common diode node 16 is coupled to a biasing source 20 through a resistive element 22. The series connected diodes 12 and 14 are connected between two additional biasing sources 24 and 26 with one of the biasing sources being coupled to the diodes through a second resistive element 28. A switching element 30 has its lead connected between one of the diode and the second resistive element 28. The switching element 30 may include a current generating means 32 coupled via an electronic switch 34 to a positive or negative voltage potential 36. The polarity of the voltage potential 36 is dependent on the whether the current generating means 32 is acting a current sink or a current source. A low loss capacitive element 38 also has one of its leads connected between one of the diodes and the second resistive element 28. The other lead of the capacitor 38 is connected to a common reference level 40 for the circuit. One side of the biasing potentials 20, 24 and 26 may be connected to the common reference level 40, or alternatively, one of the biasing potentials 20, 24 and 26 may be at the common reference level 40.

The generalized schematic of the PIN diode switch 10 of FIG. 1 also shows in phantom lines series connected PIN diodes 12A and 14A, second resistive element 28A, switching means 30A and low capacitive element 38A. The switching means 30A includes like elements as switching means 30, namely a current generating means 32A, and electronic switch 34A, and a positive or negative voltage potential 36A. Also shown in phantom lines is a ground connection at common reference level 40. The phantom elements are shown to indicate that the elements of the PIN diode switch 10 may be configured in differing arrangements while performing the same switching function. The below described embodiments of the PIN diode switch 10 are illustrative of the various configurations.

Figure 2:
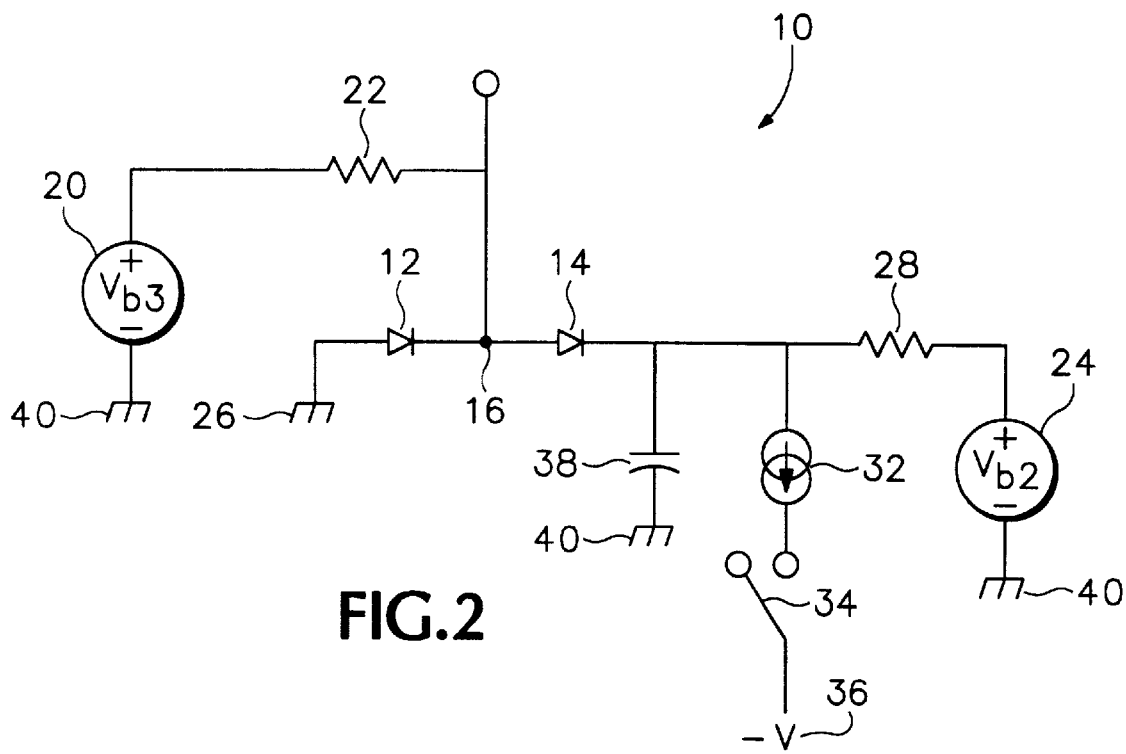
FIG. 2 is a first embodiment of the PIN diode switch according to the present invention.

Referring to FIG. 2, there is shown a first embodiment of the PIN diode switch 10. Like elements from FIG. 1 are labeled the same in FIG. 2. Note in this configuration the current generating means 32 is acting as a current sink into a negative voltage potential 36. Further, the common reference level 40 for this configuration is at ground potential with biasing source 20 and 24 being at a positive voltage potential and biasing source 26 being at the common reference level.

The closing and opening of electronic switch 34 causes the PIN diode switch 10 to respectively switch from a conductive operating state to a nonconductive operating state. Closing switch 34 causes a current to be generated through current generating means 32, which forward biases the diodes 12 and 14. Because PIN diodes have a very low resistance value in the forward biased direction, on the order of 0.6 ohms, there is little resistance through the diodes 12 and 14 to an AC signal appearing at the common diode node 16. The AC signal at the common node 16 will be coupled through two low loss paths to the reference level 40. One path is through PIN diode 14 and low loss capacitive element 38, which in the preferred embodiment is a low loss capacitor having a small capacitive reactance, typically much less than the reactance of the switched capacitor 18. The other path is through PIN diode 12 and the biasing source 26, which is at the reference level 40 as previously stated. The parallel resistive structure of the PIN diodes 12 and 14 produces an overall resistance in the circuit looking into the common node 16 of 0.3 ohms in the ON state. The low series resistance produces a circuit that provides a high Q for circuits connected to the PIN diode switch circuit 10.

Opening switch 34 removes the negative voltage potential 36 on the current generating means 32 allowing the PIN diodes 12 and 14 diodes to become reversed biased. PIN diode 12 is reversed biased by a positive voltage being applied to the common diode node 16 from the biasing source 20 through the resistive element 22. PIN diode 14 is reversed biased by a positive biasing voltage being applied to anode of diode 14 from biasing source 24 through resistive element 28. The values of the resistive elements 22 and 28 are large enough to prevent the loss of energy through the resistive elements in the OFF state. In the preferred embodiment of the invention, the resistive elements 22 and 28 are 332K ohms resistors. Also in the preferred embodiment of the invention, the absolute value of the voltage potential at the common node 16 from the biasing source 20 is one-half that of the highest biasing potential on either biasing sources 24 and 26. For example, in the configuration of FIG. 2, the biasing potential of biasing source 24 is +30 volts and the biasing potential of the biasing source 20 is +15 volts. Biasing source 26 is at ground potential. PIN diodes 12 and 14 are each reversed biased with respective voltage potentials of +15 volts. The reverse bias potentials on the PIN diodes 12 and 14 are sufficient to minimize the stray capacitance associated with the PIN diodes. The combination of the large resistive values for resistive elements 22 and 28 and the reverse bias potentials on the PIN diodes assures minimum loss of energy through the PIN diodes switch 10 in the OFF state.

Figure 3:
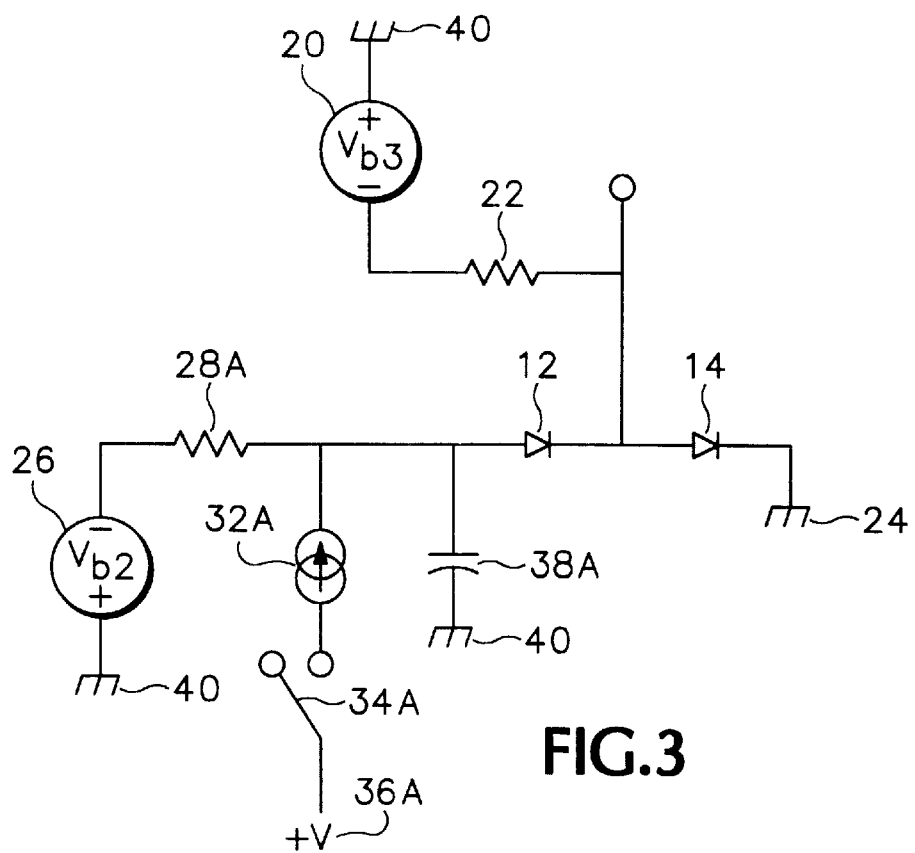
FIG. 3 is a second embodiment of the PIN diode switch according to the present invention.

Referring to FIG. 3, there is shown a second embodiment of the PIN diode switch 10 where like elements from FIG. 1 are labeled the same. Note in this configuration the current generating means 32A is acting as a current source connected to a positive voltage potential 36A through switch 34A. Further, the common reference level 40 for this configuration is at ground potential with biasing source 20 and 26 being at a negative voltage potential and biasing source 24 being at the common reference level.

The closing and opening of electronic switch 34A causes the PIN diode switch 10 to respectively switch from a conductive operating state to a nonconductive operating state as previously describe for the configuration of FIG. 2. Closing switch 34A causes current to be generated through current generating means 32A, which forward biases the PIN diodes 12 and 14. The AC signal at the common node 16 is coupled through two low loss paths to the reference level 40. One path is through PIN diode 12 and low loss capacitive element 38A. The other path is through PIN diode 14 and the biasing source 24, which is at the reference level 40 as previously stated. The parallel resistive structure of the PIN diodes 12 and 14 produces an overall resistance in the circuit looking into the common node 16 of 0.3 ohms in the ON state. The low series resistance produces a circuit that provides a high Q for circuits connected to the PIN diode switch circuit 10.

Opening switch 34A removes the positive voltage potential 36A on the current generating means 32A allowing the PIN diodes 12 and 14 to become reversed biased. PIN diode 14 is reversed biased by a negative voltage being applied to the common diode node 16 from the biasing source 20 through the resistive element 22. PIN diode 12 is reversed biased by a negative voltage being applied to anode of diode 14 from biasing source 26 through resistive element 28. As in the previous circuit configuration, the values of the resistive elements 22 and 28 are large enough to prevent the loss of energy through the resistive elements and the reduction in the Q value in the OFF state. Further, the absolute value of the biasing potential at the common node 16 is one-half that of the highest biasing potential. For example, in the configuration of FIG. 3, the biasing potential of biasing source 26 is −30 volts and the biasing potential of the biasing source 20 is −15 volts. Biasing source 24 is at ground potential. PIN diodes 12 and 14 are each reversed biased with respective voltage potentials of +15 volts. The reverse bias potentials on the PIN diodes 12 and 14 are sufficient to minimize the stray capacitance associated with the PIN diodes. The combination of the large resistive values for resistive elements 22 and 28 and the reverse bias potentials on the PIN diodes assures minimum loss of energy through the PIN diodes switch 10 in the OFF state.

Figure 4:
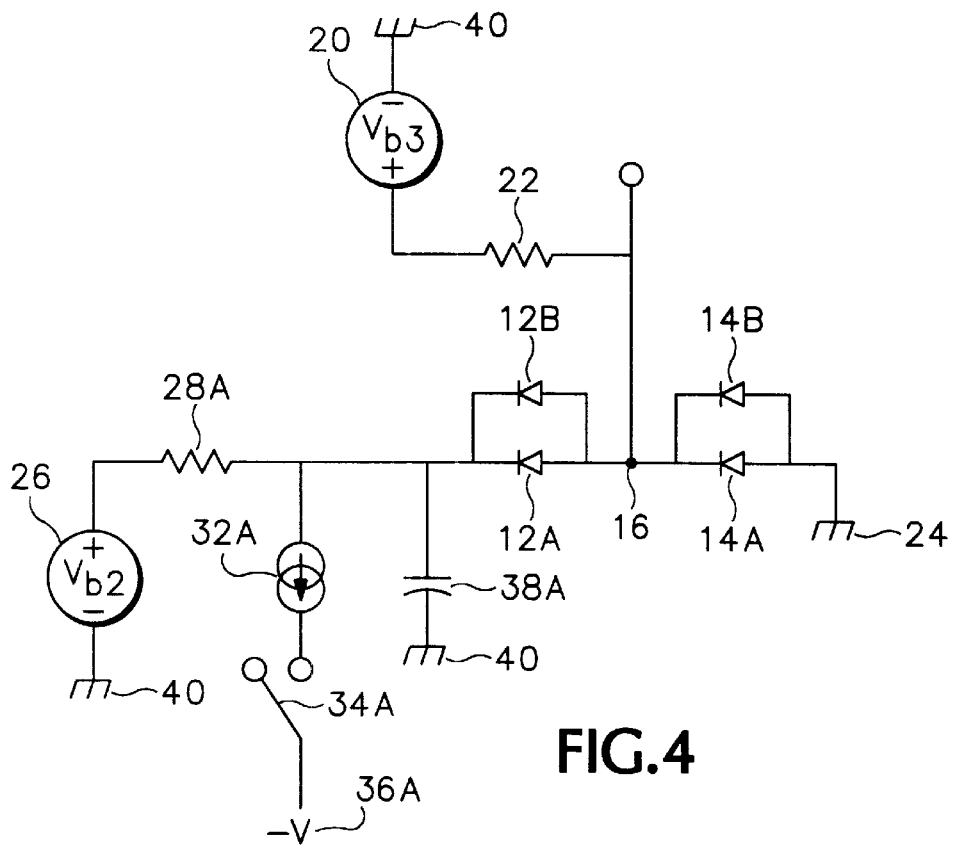
FIG. 4 is a third embodiment of the PIN diode switch according to the present invention.

Referring to FIG. 4, there is shown a further embodiment of the PIN diode switch 10 where the PIN diodes 12A and 14A are reversed. In addition, the figure shows additional PIN diodes 12B an 14B respectively coupled in parallel with PIN diodes 12A and 14A. The use of parallel PIN diodes decreases the OFF state resistance of the PIN diodes thereby increasing the Q of the PIN diode switch 10. It should be noted that the parallel PIN diodes may be used in ants of the embodiments of the PIN diode switch 10. The configuration of FIG. 4 is similar to that of FIG. 3 with the exception that the voltage potentials of the biasing sources 20 and 26 are positive values, the current generating means 32A is acting as a current sink, and the voltage potential 36A is negative.

Closing switch 34A causes a current to be generated through current generating means 32A that forward biases the PIN diodes 12A, 12B, 14A and 14B. The AC signal at the common node 16 is coupled through the two low loss paths to the reference level 40 as previously described. The parallel PIN diodes pairs 12A/12B and 14A/14B each have an effective resistance in the ON state of 0.3 ohms (0.6 ohms divided by 2). The parallel resistive structure of the PIN diodes 12A/12B and 14A/14B produces an overall resistance in the circuit looking into the common node 16 of 0.15 ohms in the ON state. This lower resistance in combination with the low capacitance produces a lower reactance circuit and increases the Q of PIN diode switch circuit 10.

Opening switch 34A removes the negative voltage potential 36A on the current generating means 32A allowing the PIN diodes 12A/12B and 14A/14B to become reversed biased. The biasing of the PIN diodes 12A/12B and 14A/14B are similar to the PIN diode switch 10 configuration of FIG. 3 with the exception that the voltage potentials of the biasing source 20 and 26 are positive instead of negative.

Figure 5:
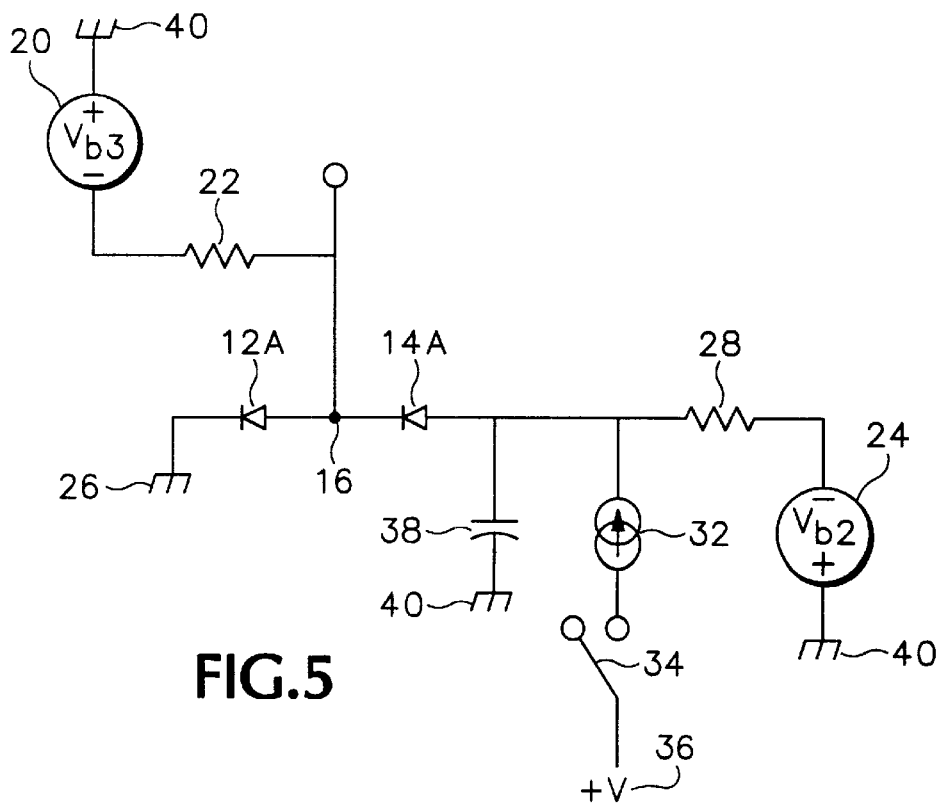
FIG. 5 is a fourth embodiment of the PIN diode switch according to the present invention.

Referring to FIG. 5, there is shown a further configuration of the reversed PIN diodes 12A and 14A. The configuration of FIG. 5 is similar to that of FIG. 2 with the exception that the voltage potentials of the biasing sources 20 and 24 are negative values, the current generating means 32 is acting as a current source, and the voltage potential 36 is positive. Closing switch 34 forward biases the PIN diodes 12A and 14A by causing a current to be generated through current generating means 32. The AC signal at the common node 16 is coupled through the two low loss paths to the reference level 40 as previously described. Opening switch 34 removes the positive voltage potential 36 on the current generating means 32 allowing the PIN diodes 12A and 14A to become reversed biased.

Figure 6:
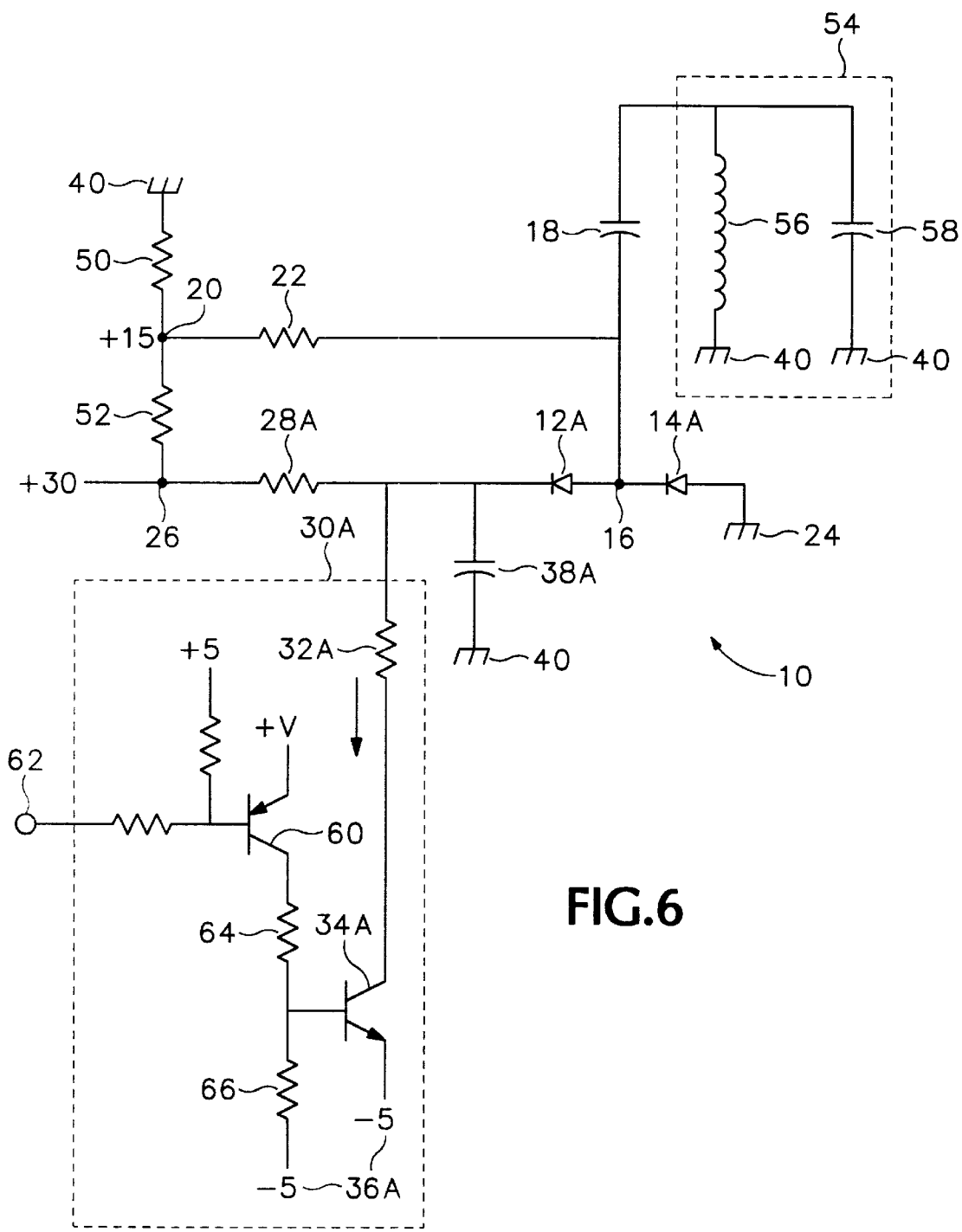
FIG. 6 is detailed schematic representation of the PIN diode switch according to the present invention.

Referring to FIG. 6, there is shown a detailed schematic representation of the PIN diode switch 10 according to the present invention. Like elements from previous drawings are labeled the same. The series connected. PIN diodes 12A and 14A are connected between biasing sources 24 and 26 with biasing source 24 being at the reference ground and biasing source 26 being at a +30 volts. In the preferred embodiment, the PIN diodes are manufactured and sold by Hewlett-Packard Company, Palo Alto Calif. under Part Number HSMP3822. The common node 16 between the two PIN diodes 12A and 14A is coupled to the biasing source 20 through resistive element 22. The biasing source 20 is implemented as part of a voltage divider network consisting of series connected resistors 50 and 52 coupled between the reference level and the biasing source 26. In the preferred embodiment, resistors 50 and 52 are 33.2 K ohm resistors producing a biasing potential of +15 volts at biasing source 20. The cathode of PIN diode 12A is connected to the biasing source 26 through resistive element 28A, which has a nominal value of 332 K ohms. The common diode node 16 is connected to a switching capacitor 18 of a resonator circuit 54 having a coil 56 connected in parallel with a capacitor 58 to the reference level 40.

The switching element 30A is connected between the cathode of PIN diode 12A and the second resistive element 28A. The switching element 30A includes a resistive element acting as a current generating means 32A coupled via the collector of a transistor acting as a electronic switch 34A to the negative voltage potential 36A. In the preferred embodiment, the resistive element, acting as the current generating means, has a nominal value of 332 ohms. The electronic switch is manufactured and sold by Motorola, Inc. under Part Number MMBT2222. The current generating means 32A acts as a current sink pulling DC current through the PIN diodes 12A and 14A and into the negative voltage potential 36A when the electronic switch 34A is conducting. A drive transistor 60, manufactured and sold by Motorola, Inc. under Part Number MMBT2907 receives a signal at input node 62 for turning ON and OFF the electronic switch 34A. The drive transistor 60 receives a signal on its base from input node 62 causing it to conduct. The conduction of transistor 60 establishes a voltage divider network consisting of resistors 64 and 66. The common node of resistors 64 and 66 is coupled to the base of electronic switch 34A. One lead of the low loss capacitive element 38A is coupled between the second resistive element 28A and the cathode of PIN diode 12A and the other lead is coupled to the reference ground 40.

In operation, a drive signal is applied via the input node 62 to the drive transistor 60 which causes the transistor to conduct and generate a positive signal on the base of electronic switch 34A. The switch 34A conducts coupling the negative potential voltage 36A to the current generating means 32A causing a current to be generated through the PIN diodes 12A and 14A. The forward biased PIN diodes 12A and 14A conduct and couple the common diode node 16, and hence the switching capacitor 18, to the low loss capacitive element 38A. AC signal current through the switching capacitor 18 is coupled through the low loss capacitive element 38A to the reference level 40 and through PIN diode 14A and biasing source 24 to the reference level 40.

Removal of the drive signal from the input node 62 causes the drive transistor 60 to stop conducting. The voltage on the base of the electronic switch transistor 34A falls to the value of the negative voltage potential of the voltage divider causing the electronic switch to open and removing the negative voltage potential on the current generating means 32A. The PIN diodes 12A and 14A are revered biased by the application of the biasing potentials of +15 volts from biasing source 20 at the common diode node 16 and the biasing potential +30 volts from the biasing source 26. The resistance values of resistive elements 22 and 28 are large to prevent energy loss into the biasing potentials and thus the lowering of the Q of the PIN diode switch 10.

The above described detailed schematic representation of the PIN diode switch 10 is based on the embodiment shown in FIG. 4. The embodiments of the other figures may equally be used in implementing a detailed circuit design for the PIN diode switch 10 according to the present invention.

A PIN diode switch 10 has been described having a biasing and control arrangement for minimizing energy loss and stray capacitance. The PIN diode switch 10 has serially connected PIN diodes 12 and 14 having a common node 16 coupled to a biasing source 20 through a first resistive element 22. The PIN diodes are also coupled between second and third biasing sources 24 and 26 with a second resistive element 28 disposed between the diodes and the second biasing source 24. The PIN diode switch 10 is controlled by switching means 30 that couples a voltage potential 36 to the PIN diodes via a current generating means 32. The switching means 30 is a transistor functioning as an electronic switch. The current generating means 32 is a resistive element that acts as a current sink or source depending on the polarity of the voltage potential 36 and the configuration of the PIN diodes 12 and 14. In the conductive ON state, two parallel paths are provided for AC current. One path is through one of the PIN diodes and a low loss capacitor 38 and the other path is through the other diode into a biasing source set at ground potential. In the nonconductive OFF state, the electronic switch is opened and the voltage potential is removed from the PIN diodes resulting in the reverse biasing of the diodes by the biasing sources 20, 24 and 26. The combination of the reverse biasing voltages on the diodes and the large resistive values of the resistive elements 20 and 28 minimizes the energy loss through the PIN diode switch in the OFF state.

Whereas many alteration and modifications to the present invention will be comprehended by a person skilled in the art after having read the foregoing description, it is to be understood that the particular embodiments shown and described by way of illustration are in no way intended to be considered limiting. References to details of particular embodiments are not intended to limit the scope of the appended claims.

What is claimed is:

1. A PIN diode switch comprising:

at least first and second series connected PIN diodes having a common node and coupled between first and second biasing sources;

a third biasing source coupled through a first resistive element to the common node;

a second resistive element coupled in series between the second biasing source and the series connected diodes;

means for switching the PIN diodes between a conductive on state and a nonconductive off state coupled to the junction of the second resistive element and the PIN diodes with the voltages of the first, second and third biasing sources being such that the difference between the voltage of the second biasing source and the voltage of the third biasing source equals the difference between the voltage of the third biasing source and the voltage of the first biasing source so the voltage across each PIN diode is equal when the PIN diodes are in the nonconductive off state; and a low loss capacitive element coupled between the junction of the second resistive element and the PIN diodes and a common reference level for the PIN diode switch, the low loss capacitive element acting as a sink for AC signals when the PIN diodes are in the on state.

2. The PIN diode switch as recited in claim 1 wherein the switching means further comprises a current generating element and an electronic switch.

3. The PIN diode switch as recited in claim 2 further comprising a positive voltage potential coupled to the current generating element through the electronic switch when the second biasing source has a negative potential.

4. The PIN diode switch as recited in claim 2 further comprising a negative voltage potential coupled to the current generating element through the electronic switch when the second biasing source has a positive potential.

5. The PIN diode switch as recited in claim 1 wherein the first biasing potential is circuit ground.

* * * * *